United States Statutory Invention Registration [19]

[11] Reg. Number: H873

Cukauskas et al. [43] Published: Jan. 1, 1991

[54] FABRICATION OF NBN BASED ELECTRONIC DEVICES WITH SILICON BARRIERS

[75] Inventors: Edward Cukauskas, Vienna, Va.; William Carter, Chelmsford, Mass.

[73] Assignee: United States of America, Washington, D.C.

[21] Appl. No.: 374,035

[22] Filed: Jun. 30, 1989

[51] Int. Cl.[5] ..... B05D 5/12; H01L 39/22

[52] U.S. Cl. ..... 427/63; 427/62; 437/910; 357/5; 505/817; 505/832

[58] Field of Search ..... 427/62, 63; 437/910; 357/5; 505/817, 832

*Primary Examiner*—Peter A. Nelson

*Attorney, Agent, or Firm*—Thomas E. McDonnell; Peter T. Rutkowski

[57] ABSTRACT

A method of making a Josephson Junction is disclosed which includes the steps of depositing a base electrode layer of a refractory superconducting material on a substrate, depositing a first passivation layer on the base electrode, depositing a barrier layer of refractory insulating semiconducting material on the passivation layer, depositing a second passivation layer on the barrier layer, and depositing a counter electrode on the second passivation layer. The layers are deposited at a substrate temperature of from about 50° C. to about 700° C. in an Ultra-High Vacuum sputtering system at a base pressure of less than or equal to $5\times10^{-8}$ Torr. In the preferred embodiment a base electrode and counter electrode of NbN are separated by a barrier layer of hydrogenated silicon. When exposed to high post processing temperatures this structure maintains a chemically stable interface with the substrate.

12 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

FABRICATION OF NBN BASED ELECTRONIC DEVICES WITH SILICON BARRIERS

BACKGROUND OF THE INVENTION

1. Field of the Invention

This invention relates, generally, to electronic devices, and, specifically to a method for making a Josephson junction, from NbN/Si/NbN, at elevated substrate temperatures.

2. Description of the Prior Art

Low resistivity niobium nitride thin films are usually reactively sputtered at temperatures greater than 700° C. This material has a resistivity of less than 80 $\mu$, $\Omega$-cm. NbN which is sputtered at ambient temperature has high resistivity, is often under strain or has a columnar structure. These properties are not the most desirable for the deposition of subsequent layers.

U.S. Pat. No. 4,426,268 reports a method for forming high $T_c$ film of niobium nitride without heating the substrate. Introducing carbon into the film during reactive sputtering increases the $T_c$ of a thin film of niobium nitride to near that of bulk niobium nitride.

Josephson junctions fabricated with refractory NbN or Nb superconducting electrodes incorporate artificial barriers such as silicon, germanium, MgO or other suitable material. These barriers are normally deposited at cooled or ambient substrate temperature to assure an amorphous film with uniform coverage. The barrier is then oxidized to plug any "pinholes".

U.S. Pat. No. 4,458,409 relates to an all niobium Josephson junction cf a niobium base electrode, a niobium-oxide tunnel barrier and a niobium counter electrode. A non-continuous layer of gold covers the tunnel barrier oxide layer. The areas not covered by the gold layer are strongly oxidized. The gold becomes superconducting by the proximity effect and allows a tunnel current to flow.

U.S. Pat. No. 4,176,365 discloses a Josephson tunnel junction with niobium superconductive electrodes separated by a hydrogenated amorphous semiconductor material (silicon, germanium and alloys thereof), doped or undoped. This barrier material provides high current density.

U.S. Pat. No. 4,220,959 is for a Josephson junction with niobium nitride superconductive electrodes and a polycrystalline semiconductor tunnelling barrier of silicon, germanium or an alloy thereof, doped or undoped, between the electrodes.

U.S. Pat. No. 4,768,069 pertains to a Josephson junction of niobium nitride on a substrate, an epitaxial layer on the niobium nitride of a pseudo-binary compound of composition 3-97 atomic % MgO/97-3 atomic % CaO and an epitaxial layer of niobium nitride on the pseudo-binary layer. Since the MgO-CaO solid solution have the same lattice spacing as the niobium nitride a good quality top layer of niobium nitride is obtained.

These techniques can limit the substrate temperature of any subsequent layers or post processing temperature. If they are carried out at room temperature, succeeding processing and post-processing temperatures at higher temperatures can result in material migration, contamination and degradation. High quality NbN is deposited at elevated substrate temperatures. It is desirable to find an artificial barrier which can be deposited at substrate temperatures approaching 700° C. and still maintain a stable interface with NbN. Current barrier technology is not compatible with high substrate temperature.

SUMMARY OF THE INVENTION

Accordingly, an object of this invention is to provide a strip line or transmission line device in which subsequent layers can be deposited at elevated temperatures without serious degradation to the base electrode/barrier interface.

Another object of this invention is to provide a strip line or transmission line device which may be exposed to high post processing temperatures without serious degradation to the base electrode/barrier interface.

Also, an object of this invention is to fabricate a Josephson junction without an oxidation step.

Further, an object of this invention is to provide a thinner counter electrode thickness which results in reduced stress and better adhesion.

These and other objects are accomplished by NbN/Si/NbN tunnel junctions with silicon barriers sputtered at substrate temperatures to 700° C. in a clean environment.

BRIEF DESCRIPTION OF THE DRAWINGS

A more complete appreciation of the invention and many of the attendant advantages thereof will be readily understood by reference to the following detailed description when considered in connection with the accompanying drawing wherein.

DESCRIPTION OF THE PREFERRED EMBODIMENT

Figure 1:
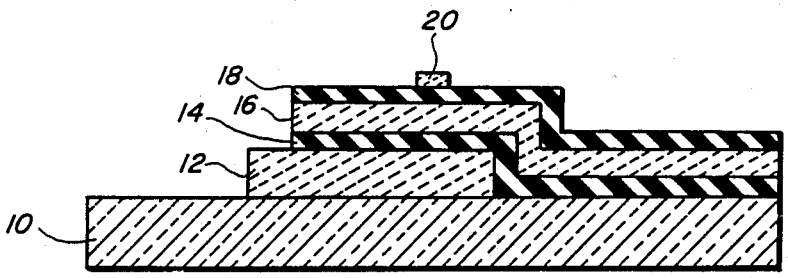
FIG. 1 is a schematic representation a Josephson junction of the present invention.

The general category of electronic devices of this invention is a strip line or transmission line. One example is the Josephson junction as shown in FIG. 1, which includes a substrate 10, a base electrode 12, passivation layers 14 and 18, a barrier layer 16, and a counter electrode 20.

This invention describes a method of fabricating a Josephson junction with a layered structure of ground plane/insulator/metallization where the base electrode and barrier are both deposited at substrate temperatures from about 50° C. to about 700° C. The higher substrate temperature results in less limitation on post processing temperatures. Thus, successive layers are deposited at elevated substrate temperature at high purity. Use of the term "elevated substrate temperature" in this application means a temperature greater than room temperature.

In the preferred embodiment, a base electrode 12 of refractory high $T_c$ superconducting (16° K) material which is compatible with the barrier material 16 is reactively sputtered, deposited by chemical vapor deposition or deposited by electron beam evaporation onto a substrate 10 at from about 50° C. to about 700° C. The preferred substrate temperature is about 500° C. to about 700° C. and the most preferred substrate temperature is about 700° C. The base electrode material 12 is any one of those which are part of the classes known as B1 materials or A15 materials. Examples of B1 materials are niobium nitride, niobium carbide, niobium carbonitride and molybdenum nitride. B1 materials are reactively sputtered or deposited by chemical vapor deposition. An example of an A15 material is $Nb_3Sn$. A15 materials are deposited by electron beam evaporation. Deposition must be of a purity such that there is no more than one monolayer (atomic layer) of oxide on the surface of the superconducting material. Such a purity is possible in a clean environment with a base pressure of less than or equal to $5\times10^{-8}$ Torr prior to material growth, such as in a ultra-high vacuum sputtering system.

A passivation layer 14 of insulating material, such as silicon, is reactively sputtered onto the base electrode in argon. The barrier material 16 is reactively sputtered argon/hydrogen gas mixtures in an ultra-high vacuum (UHV) sputtering system onto the heated NbN base electrode 12 with the silicon passivation layer 14. The hydrogen content of the gas mixture can range from about 0% to about 50% by volume. The preferred hydrogen content is from about 10% to about 25% by volume. The most preferred hydrogen content is about 15% by volume. The amount of hydrogen incorporated into the silicon is dependent upon the substrate temperature.

The barrier material 16 is any suitable refractory insulating material, is capable of being sputtered at an elevated substrate temperature and is compatible with the material of the passivation layer 14, such as hydrogenated silicon, silicon nitride, silicon carbide, or composite silicon/germanium in the case of a silicon passivation layer. The most preferred is hydrogenated silicon. Depositing the barrier layer 16 at these temperatures results in an amorphous material.

The elevated temperature for barrier deposition is possible because of the compatibility of the barrier material 16 and the base electrode material 12 and because of the purity level at which the base electrode material 12 is deposited. The clean environment provided by the UHV chamber prevents degradation of the base electrode 12 when heated. The combination of these factors permit the preparation of a clean surface which is uniformly coated by the silicon passivation layer 14 and subsequent barrier growth. A second passivation layer 18 of silicon is then sputtered on the barrier layer 17. Finally, a counter electrode 20 is deposited on the passivation layer 18 without breaking the vacuum.

Another example of an electronic device with a layered structure to which this invention is applicable is a superconducting kinetics inductance delay line. This device requires the deposition of thin films (400–500 Å) of materials, such as niobium nitride, for the ground plane and the metallization. This invention allows deposition of a good quality thin film of niobium nitride with a surface which permits further deposition without problem.

Doping the barrier material allows fabrication of a polycrystalline metal/semiconductor contact device. Such a device permits a non-Schottky device to perform like a Schottky device. An example is a metal/insulator/semiconductor (MIS) device. The structure is a lightly doped semiconductor, such as silicon, under a layer of insulating material, such as undoped silicon, under a layer of metal, such as niobium nitride. The insulating material and the metal would be deposited at elevated temperature and in a clean environment.

The invention having been generally described, the following example is given as a particular embodiment of the invention and to demonstrate the practice and advantages thereof. It is understood that the example is given by way of illustration and is not intended to limit the specification or the claims to follow in any manner.

EXAMPLE I

Referring to FIG. 1, a NbN base electrode material 12 is reactively sputtered in an ultra-high vacuum (UHV) sputtering system onto a sapphire substrate 10 in an argon/nitrogen gas mixture to which a small amount of methane is added. Small amounts of carbon from the methane are incorporated into the film. The bare electrode is outgassed at 700° C. and sputtered etched at a power density of 0.1 W/cm$^2$ for 30 minutes in 1.0 Pa of pure argon. A thin layer of silicon 14 of approximately 1 nm thickness is then sputtered in 1.0 Pa of argon at 0.8 W/cm$^2$ by passing the substrate under the silicon target twice. This passivation layer 14 is then followed by a 3 nm barrier layer 16 of hydrogenated amorphous silicon sputtered under the same condition with 15% $H_2$/Ar gas mixture. The barrier layer 16 is deposited at 700° C. and then allowed to cool in UHV for approximately 1 hour. The barrier layer 16 is then capped with another passivation layer 18 as above. A 60 nm NbN counter electrode 20 is then deposited at 15° 0 C. and 2.5 W/cm$^2$ in 1.0 Pa argon. The NbN is deposited without breaking the vacuum. No oxidation step is necessary in this technique. Oxidation of the barrier 16 often results in oxygen diffusing into the base electrode or reacting with the counter electrode 20, which is undesirable. In using a NbN counter electrode 20, cooling after barrier deposition is not required.

Low resistivity NbN has a magnetic penetration depth of less than 200 nm and a 300 nm counter electrode film thickness would be adequate for most applications. This thin film can reduce the stress and result in increased adhesion.

Deposition of these materials at elevated substrate temperatures result in fewer defects and dangling bonds. These properties are of importance in the design of millimeter wave SIS mixers and associated circuitry or other superconducting electronic components or circuits. The objective is to have electrode materials and barriers for use in the fabrication of high quality refractory layered structures, such as Josephson junctions suitable for SIS mixer operation above 100 GHz and at temperatures achievable by compact closed cycle refrigeration systems.

Niobium nitride metallization layers are suitable for device structures which may require high temperature post processing of up to 500° C. because the metal/semiconductor interface does not seriously degrade or interdiffuse at high temperatures if the metallization is deposited at elevated temperatures. When exposed to high post processing temperature this metallization maintains a chemically stable interface with the substrate.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letter of Patent of the United States is:

1. A method of making a Josephson junction, comprising the steps of:

depositing a base electrode layer of refractory superconducting material on a substrate;

depositing a first passivation layer on the layer of refractory superconducting material;

depositing a barrier layer of refractory insulating semiconducting material on the passivation layer wherein the refractory insulating semiconducting material is compatible with both the passivation layer and said base electrode layer, and is capable of being deposited at an elevated substrate temperatures;

depositing a second passivation layer on the barrier layer of refractory insulating semiconducting material; and depositing a counter electrode on said second passivation layer, wherein said layers are deposited at a base pressure of less than or equal to $5\times10^{-8}$ Torr.

2. A method of making a Josephson junction as recited in claim 1 wherein the layers are deposited in an ultra-high vacuum sputtering system without breaking the vacuum of said sputtering system.

3. A method of making a Josephson junction as recited in claim 2 wherein the layer of refractory superconducting materials niobium nitride base electrode is reactively sputtered in an argon/nitrogen atmosphere to which a small amount of methane is added.

4. A method of making a Josephson junction as recited in claim 3 wherein the passivation layer is silicon is reactively sputtered onto the base electrode in argon.

5. A method of making a Josephson junction as recited in claim 4 wherein the barrier layer of hydrogenated silicon is reactively sputtered onto the passivation layer of silicon in argon/hydrogen gas mixture.

6. A method of making a Josephson junction as recited in claim 5 wherein the hydrogen in the argon/hydrogen gas mixture is from about 0% to about 50% by volume.

7. A method of making a Josephson junction as recited in claim 6 wherein the hydrogen in the argon/hydrogen gas mixture is from about 10% to about 25% by volume.

8. A method of making a Josephson junction as recited in claim 7 wherein the hydrogen in the argon/hydrogen gas mixture is about 15%.

9. A method of making a Josephson junction as recited in claim 8 wherein the substrate temperature is from about 500° C. to about 700° C.

10. A method of making a Josephson junction as recited in claim 8 wherein the substrate temperature is from about 500° C. to about 700° C.

11. A method of making a Josephson junction as recited in claim 8 wherein the substrate temperature is about 700° C.

12. A method of making a Josephson junction as recited in claim 1 wherein said counter electrode is selected from the group consisting of niobium and niobium nitride.

* * * * *